United States Patent

Bozada et al.

[11] Patent Number: 6,004,881
[45] Date of Patent: Dec. 21, 1999

[54] DIGITAL WET ETCHING OF SEMICONDUCTOR MATERIALS

[75] Inventors: Christopher A. Bozada, Dayton; Gregory C. DeSalvo; John L. Ebel, both of Beavercreek; Charles L.A. Cerny, Huber Heights; Ross W. Dettmer, Dayton; James K. Gillespie, Cedarville, all of Ohio; Charles K. Havasy, Laurel, Md.; Thomas J. Jenkins, Fairborn, Ohio; Kenichi Nakano; Carl I. Pettiford, both of Beavercreek, Ohio; Tony K. Quach; James S. Sewell, both of Kettering, Ohio; G. David Via, Dayton, Ohio

[73] Assignee: The United States of America as represented by the Secretary of the Air Force, Washington, D.C.

[21] Appl. No.: 08/990,881

[22] Filed: Dec. 15, 1997

Related U.S. Application Data

[60] Provisional application No. 60/041,486, Apr. 24, 1997.

[51] Int. Cl.$^6$ ............................. H01L 21/302
[52] U.S. Cl. ................... 438/705; 438/750; 438/751; 438/752; 438/753
[58] Field of Search .................. 438/705, 747, 438/748, 750, 751, 752, 753, 756

[56] References Cited

U.S. PATENT DOCUMENTS

| | | |
|---|---|---|
| 4,026,741 | 5/1977 | Chang et al. ........................... 156/628 |
| 4,248,683 | 2/1981 | Shaw ................................... 204/129.3 |
| 4,700,457 | 10/1987 | Matsukawa . |
| 4,971,654 | 11/1990 | Schnegg et al. . |
| 4,994,140 | 2/1991 | Kenzo et al. . |

(List continued on next page.)

FOREIGN PATENT DOCUMENTS

| | | |
|---|---|---|
| 4-098833 | 3/1992 | Japan . |
| 8-086725 | 4/1996 | Japan . |

OTHER PUBLICATIONS

"X–Ray Photoelectron Spectroscopic and Atomic Force Microscopic Study of GaAs Etching With a HCL Solution"; Appl. Surf. Sci. (1994), Song et. al, 82/83; abstract only.

T. Meguro, M. Ishii, H. Kodama, M. Hamagaki, T. Hara, Y. Yamamoto and Y. Aoyagi, "Layer–by–Layer Controlled Digital Etching by Means of an Electron–Beam–Excited Plasma System", Jpn. J. Appl. Phys., 29, 2216 (1990).

Y. Aoyagi, K. Shinmura, K. Kawasaki, T. Tanaka, K. Gamo, S. Namba and I. Nakamoto, "Molecular Layer Etching of GaAs", Appl. Phys. Lett., 60, 968 (1992).

M. Ishii, T. Meguro, H. Kodama, Y. Yamamoto and Y. Aoyagi, "Study of Surface Processes in the Digital Etching of GaAs", Jpn. J. Appl. Phys., 31, 2212 (1992).

(List continued on next page.)

Primary Examiner—Robert Kunemund
Assistant Examiner—George Goudreau
Attorney, Agent, or Firm—Gerald B. Hollins; Thomas L. Kundert

[57] ABSTRACT

A room temperature wet chemical digital etching technique for, gallium arsenide or other semiconductor material. Hydrogen peroxide and an acid are used in a two step etching cycle to remove the gallium arsenide in approximately 15 Å limited increments. In the first step of the cycle, gallium arsenide is oxidized by, for example, 30% hydrogen peroxide to form an oxide layer that is diffusion limited to a thickness of, for example, 14–17 Å for time periods from 15 seconds to 120 seconds. The second step of the cycle removes this oxide layer with an acid that does not attack unoxidized gallium arsenide. These steps are repeated in succession using new reactant materials and cleaning after each reactant (to prevent reactant contamination) until the desired etch depth is obtained. Experimental results are presented demonstrating the etch rate and process invariability with respect to hydrogen peroxide and acid exposure times. A method for using a Hall effect measurement to determine the achieved change in surface layer thickness of doped semiconductor material is also included.

20 Claims, 2 Drawing Sheets

U.S. PATENT DOCUMENTS

| | | | |
|---|---|---|---|
| 5,028,584 | 7/1991 | Schultheiss et al. | 505/1 |
| 5,178,718 | 1/1993 | DeKeijser et al. | 156/614 |
| 5,181,985 | 1/1993 | Lampert et al. . | |
| 5,186,750 | 2/1993 | Sugiura et al. | 118/50.1 |
| 5,294,568 | 3/1994 | McNeilly et al. . | |
| 5,310,989 | 5/1994 | Russell et al. . | |
| 5,395,474 | 3/1995 | Suzuki et al. . | |
| 5,449,435 | 9/1995 | Ageno et al. . | |
| 5,498,557 | 3/1996 | Negishi et al. . | |
| 5,500,079 | 3/1996 | Nishizawa et al. . | |
| 5,567,659 | 10/1996 | Pakulski et al. | 437/228 |
| 5,569,611 | 10/1996 | Imai . | |
| 5,594,267 | 1/1997 | Ema et al. | 257/368 |
| 5,609,721 | 3/1997 | Tsukune et al. . | |
| 5,612,234 | 3/1997 | Ha | 437/40 |

OTHER PUBLICATIONS

T. Matsuura, J. Murota, and Y. Sawada, "Self–Limited Layer–by–Layer Etching of Si by Alternated Chlorine Adsorption and $Ar^+$ Ion Irradiation", Appl. Phys. Lett., 63, 2803 (1993).

T. Meguro, M. Ishii, H. Kodama, Y. Yamamoto, K. Gamo, and Y. Aoyagi, "Surface Processes in Digital Etching of GaAs", Thin Solid Films, 225, 136 (1993).

P.A. Maki and D.J. Ehrlich, "Laser Bilayer Etching of GaAs Surfaces", Appl. Phys. Lett., 55, 91 (1989).

M. Ishii, T. Meguro, K. Gamo, T. Sugano, and Y. Aoyagi, "Digital Etching Using KrF Excimer Laser: Approach to Atomic–Order–Controlled Etching by Photo Induced Reaction", Jpn. J. Appl. Phys., 32, 6178 (1993).

S. Takatani and T. Kikawa, "Digital Etching of GaAs Using Se Molecular Beam and Atomic Hydrogen Beam", Appl. Phys. Lett., 65, 2585 (1994).

F. Djamdji and R. Blunt, "Hall Mobility Profiling in High Electron Mobility Transistor Structures", Materials Science and Engineering, B20, 77 (1993).

T. Meguro, M. Hamagaki, S. Modaressi, T. Hara, Y. Aoyagi, M. Ishii, and Y. Yamamoto, "Digital Etching of GaAs: New Approach of Dry Etching to Atomic Ordered Processing", Appl. Phys. Lett., 56, 1552 (1990).

G. Desalvo, R. Kaspi and C. Bozada, "Citric Acid Etching of $GaAs_{1-x}Sb_x$, $Al_{0.5}Ga_{0.5}Sb$, and InAs for Heterostructure Device Fabrication", J. Electrochem. Soc., 141, 3526 (1994).

G. DeSalvo, D. Look, C. Bozada and J. Ebel, "Depth Measurement of Doped Semiconductors Using the Hall Technique", J. Appl. Phys. 81, 281 (1996).

G. DeSalvo et al, "Wet Chemical Digital Etching of GaAs at Room Temperature", *J. Electrochem. Soc.*, vol. 143, No. 11, Nov. 1966, pp. 3652–3656.

DIGITAL WET ETCHING OF SEMICONDUCTOR MATERIALS

This application claims priority from Provisional Application number 60/041,486 filed Apr. 24, 1997.

RIGHTS OF THE GOVERNMENT

The invention described herein may be manufactured and used by or for the Government of the United States for all governmental purposes without the payment of any royalty.

BACKGROUND OF THE INVENTION

This invention concerns the field of semiconductor material etching by wet process techniques.

In the fabrication of transistors and other semiconductor devices there is increasing need for precisely controllable processing steps, steps which can define small features in the semiconductor material layers of the device. In other words, there is need in the semiconductor art for processing such as in the defining of field-effect transistor gate region elements, i.e., processing capable of smaller physical sizes and more accurate feature position location than is presently feasible. Coincidentally with arising of this need, there has evolved apparatus and techniques capable of measuring the dimensions achieved by any such improved processing. The present invention relates to such improved processing in the area of wet process semiconductor material etching.

By way of contrast it is notable that the first digital etching techniques developed use gas and plasma chemical sources to perform the digital etch and may therefore be classified as dry processes. This invention is believed notable in its use of wet chemicals to perform both steps of a digital etch, forming a completely wet chemical digital etching technique.

SUMMARY OF THE INVENTION

The present invention provides for improved control of wet etching steps used in the definition of dimension-critical areas of a semiconductor device such as a field-effect transistor and especially to improve control in small geometry areas such as the gate dimensions and gate location in such a transistor. The invention provides a time tolerant sequence in which normally combined processing steps are separated to achieve notably enhanced process control. The invention involves low temperature (e.g., room temperature) wet chemical reactions as opposed to the dry gasses and elevated temperatures of other material removal techniques.

It is an object of the present invention therefore to provide a closely controllable semiconductor material wet etching arrangement.

It is another object of the invention to provide a semiconductor material etching arrangement which may be used with periodic table group III–V semiconductor materials such as gallium arsenide.

It is another object of the present invention to provide a semiconductor material etching arrangement which may be varied for use with a variety of different semiconductor materials; materials which include other periodic table group III–V semiconductor materials and additional materials such as silicon, for example.

It is another object of the present invention to provide a precision semiconductor material removal arrangement in which wet processing at room or near room temperatures is used.

It is another object of the present invention to provide a semiconductor material etching arrangement in which better controlled etching is achieved in part through careful avoidance of intermixing between separately used reactant materials.

It is another object of the present invention to provide a semiconductor material etching arrangement which is largely self limiting at a controlling step in a repeating cycle of etching steps.

It is another object of the present invention to provide a semiconductor material etching arrangement which is largely self limiting with respect to reactant exposure time to semiconductor material.

It is another object of the present invention to provide a semiconductor material etching arrangement which is largely self limiting in the etch depth achieved with each step in a step series and therefore is of a non-critical etching time nature.

It is another object of the present invention to provide semiconductor material etching apparatus which is helpful in avoidance of harmful intermixing between two often combined separate etching reactant materials.

It is another object of the present invention to provide a semiconductor material etching arrangement in which a semiconductor material oxidizing step and the removal of oxidized semiconductor material are separated in time for advantageous reasons.

Additional objects and features of the invention will be understood from the following description and claims and the accompanying drawings.

These and other objects of the invention are achieved by a wet process electrical current-free high resolution stepwise method of removing a selected thickness of semiconductor material from the surface of a semiconductor wafer, said method comprising the steps of:

oxidizing a topmost surface portion of said semiconductor material with a wet process oxidizing first fresh reactant material;

said oxidizing step being of a zero electrical current flow nature and having self-limiting properties as to achieved oxidation semiconductor material layer thickness by way of a diminishing return timewise decreasing rate of alteration reaction mechanism;

removing said oxidizing first reactant material from said semiconductor material and said altered surface portion thereof with a spinning wafer rinsing operation sufficient to preclude significant intermixing concurrent presence of said oxidizing first reactant material with subsequently applied reactant materials on said wafer;

etching away said oxidized layer of said semiconductor material with a wet process second fresh reactant material;

said wet process second fresh reactant material being selectively reactive with said chemically altered semiconductor material topmost surface portion and relatively non-reactive with underlying non-oxidized portions of said semiconductor material;

rinsing said wet process second fresh reactive material from said remaining semiconductor material using a second spinning wafer rinse until intermixed second and subsequent reactive material activity with said semiconductor material is precluded; and repeating said oxidizing, removing, a taking way and rinsing steps in sequence using fresh materials until said selected thickness of said semiconductor material has been removed.

DETAILED DESCRIPTION

Figure 1:
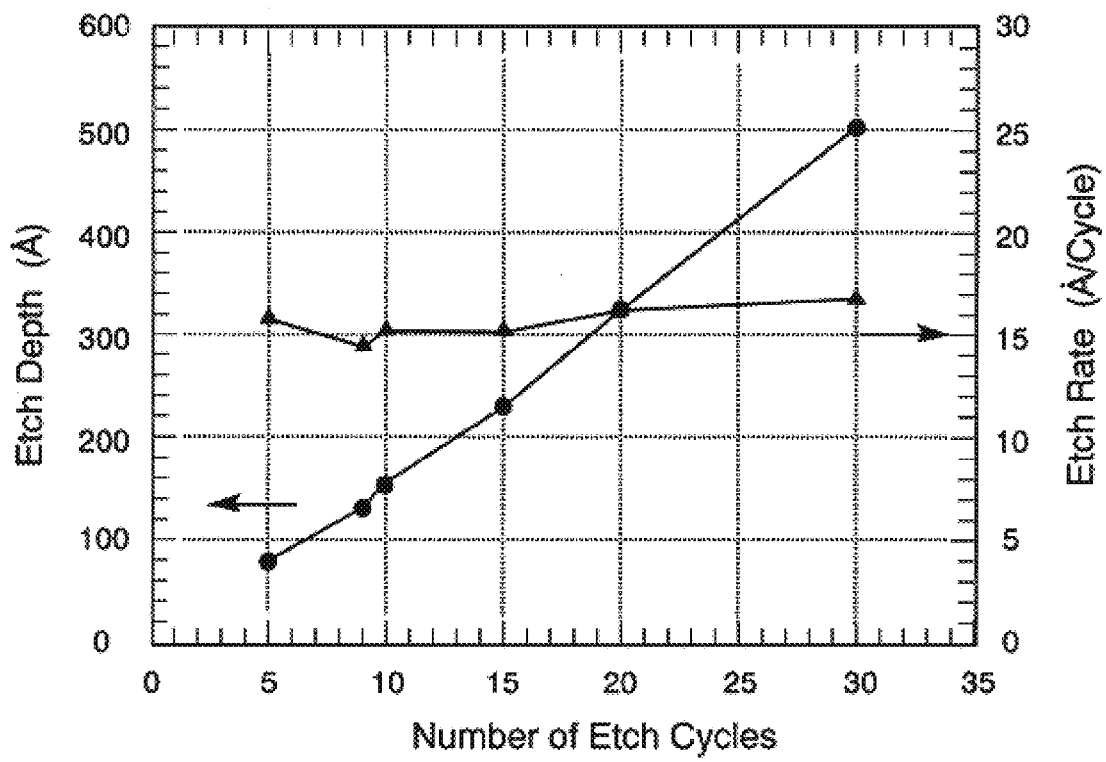
FIG. 1 shows typical measured etch depth and calculated etch rate as a function of the number of digital etch cycles performed using hydrochloric acid and hydrogen peroxide reactants according to the present invention etching arrangement.

Modern growth techniques such as molecular beam epitaxy (MBE) and metal-organic chemical vapor deposition (MOCVD) have demonstrated the ability to grow semiconductor layers with atomic layer precision, controllable material mole fractions, and precise dopant concentrations. This control allows for the growth of material structures providing optimum device performance as determined by device theory, modeling and fabricated device characterization. However, process techniques capable of removing material with atomic precision (i.e., within several atomic monolayers) are needed to obtain the full benefits of these optimum structures. Because the digital etching technique of the present invention controllably removes several atomic layers of material, it is believed to provide the etching arrangement necessary to fabricate such optimum devices.

By way of additional explanation earlier work regarding the digital etching of gallium arsenide has employed various techniques such as:

(1) reactive ion etching (RIE) employing $Cl_2$ gas to form $GaCl_3$ and $AsCl_3$ compounds which are then removed by one of low energy electrons, Argon ions, an Argon Fluorine laser, a Krypton Fluorine laser, or by thermal etching above 290° C.;

(2) molecular beam epitaxy (MBE) using a molecular beam of Se to form a monolayer of $Ga_2Se_3$ on the surface, which is removed using atomic hydrogen (H*); and (3) anodic oxidation of GaAs, forming $Ga_2O_3$ and other oxide compounds to a fixed depth, which are then removed with a wet chemical etchant. It is notable that a conduction of anodic electrical current in this process requires the presence of a conductive wafer or conductive layer on the wafer in contrast with the present invention.

This invention uses wet chemicals at room temperature and in a non-electrochemistry setting to perform each of two digital etching steps for gallium arsenide, for example. The disclosed wet etching technique moreover uses standard device fabrication chemicals and provides an economical and controllable etch with etch depths of approximately 15 Å. As in normal device fabrication, a photoresist mask can be used with this digital etching process to pattern the etching, a pattern which is not possible with the RIE or MBE techniques used in earlier processes. Also, wet chemical digital etching according to the invention does not require high vacuum nor does it heat the wafer as has been reported for RIE and as is required by MBE (heat to 450° C.–500° C.). This process also does not require an ohmic contact or a conducting layer/substrate as does an electrochemical process such as anodic oxidation. Finally, the disclosed wet chemical digital etching has the ability to save processing time since it does not require the use and preparation of specialized equipment (such as RIE, MBE or an anodic oxidation system).

The digital etching process of the present invention is believed usable for any semiconductor material (or any other material) that can be oxidized or otherwise altered to a chemically differentiable state over a short time period to achieve a diffusion limited new material (e.g., oxidation) an oxide of thickness on the order of several atomic monolayers e.g., a thicknesses between 1 and 20 atomic monolayers of semiconductor material.

The digital etching process of the present invention is found to be useful in the shallow etching needed for gate recessing of GaAs based field effect transistors, for example. Such transistors as metal semiconductor field-effect transistors (MESFET), high electron mobility transistors (HEMT), and pseudomorphic high electron mobility transistors (PHEMT) are included in this group as is the fabricating of quantum wires. Devices of these types and their fabrication by standard etching procedures have been described in the publications of K. B. Chough, T. Y. Chang, M. D. Feuer, N. J. Sauer, and B. Lalevic, *IEEE Electron Dev. Lett,* 13, 451 (1992); F. Hirler, R. Kuchler, R. Strenz, G. Abstreiter, G. B öhm, J. Smoliner, G. Tränkle, and G. Weimann, *Surf. Sci.,* 263, 536 (1992). The use of digital etching to make devices of this type has been described in the publication of G. C. DeSalvo, J. L. Ebel, C. A. Bozada, J. P. Barrette, C. L. Cerny, R. W. Dettmer, J. K. Gillespie, C. K. Havasy, T. J. Jenkins, K. Nakano, C. I. Pettiford, T. K. Quach, J. S. Sewell, and D. G. Via, 1996 *Intl. Conf. on GaAs Mfg. Technol.* (GaAs ManTech), 29 (April 1996).

Devices of these types have also been described in a series of U.S. patent applications involving many of the same inventors as the present application; these applications are identified as "Metal Semiconductor Field-Effect Transistor (MESFET) Device With Single Layer Metal", Ser. No. 08/684,759; now U.S. patent U.S. 5,796,131 "Single Layer Integrated Metal Process for Metal Semiconductor Field-Effect Transistor (MESFET)", AFD 00157, Ser. No. 08/684, 760; "High Electron Mobility Transistor (HEMT) and Pseudomorphic High Electron Mobility Transistor (PHEMT) Devices With Single Layer Integrated Metal", Ser. No. 08/684,756, now U.S. Pat. No. 5,698,870; "Single Layer Integrated Metal Process for High Electron Mobility Transistor (HEMT) and Pseudomorphic High Electron Mobility Transistor (PHEMT)" AFD 00082, Ser. No. 08/684,761; "Field-Effect Transistor Process With Semiconductor Mask, Single Layer Integrated Metal, and Dual Etch Stops" AFD 00169, Ser. No. 08/684,755; and "Field-Effect Transistor Device With Single Layer Integrated Metal and Retained Semiconductor Masking", Ser. No. 08/684,734, now U.S. Pat. No. 5,698,900 which are all filed of even date and are currently in various states of examination/prosecution before the U.S. Patent and Trademark Office. The contents of these six applications is hereby incorporated by reference herein.

The gate recess etch processing step in MESFET, HEMT and pHEMT device fabrication is in fact often the most critical processing step in fabricating microwave frequency devices. Precise removal of the n-GaAs ohmic region and any extraneous barrier or channel material is necessary to provide optimal performance in such devices. An over-recessed or under-recessed gate region results in either degraded device performance or destruction of the FET device. Current MMIC production using HEMT and pHEMT structures often provides a GaAs/AlGaAs heterointerface layer which allows the use of selective gate recess etches to remove the GaAs (or InGaAs) ohmic contacting layers without etching the AlGaAs barrier layer. However, for standard MESFET production, there is no built-in heterostructure to use a selective gate recess etch to allow the precise removal of the n-GaAs ohmic region and extraneous channel material. Furthermore, it may be useful to recess the gate region slightly into the AlGaAs barrier layer in HEMT and pHEMT devices in order to obtain a specific transistor characteristic, such as lowered pinch off voltage or shifted peak transconductance voltage-towards a desired value. For these cases, it is necessary to rely on timed etching using an etchant solution with a known etch rate. However, this technique has the potential to vary over time, and can lower device yields. The digital etching method of the present invention is believed to offer an alternative arrangement.

Conventional periodic table group III–V semiconductor material etching occurs by combining two chemical reactions into a single etching system. In this conventional single system process, the first chemical reaction occurs at the semiconductor-etchant interface, forming a new surface compound, which is removed by a second chemical reaction using a second reactant—a reactant already present in the clothing system. The digital etching method of the present invention differs from this technique by separating the chemical reactions into two distinct process steps.

Generally, the digital etching method of the present invention consists of a wet two step chemical process to remove a fixed thickness of material. Repetition of this two step process is used to obtain a desired etch depth in integral multiples of the depth achieved by a single digital etch cycle. The first step of a digital etch cycle uses a chemical reaction to form a thin layer of a new molecular compound at the semiconductor surface. Because this chemical reaction is diffusion limited, the thin layer formed will generally have a constant thickness for each two step cycle employed. In the second step, another chemical reaction is used to selectively remove the new molecular compound layer from the surface without affecting the unreacted semiconductor material underneath. This process is in contrast with, for example, the dry process reactive ion etching which has been used heretofore but which is found to be cumbersome in practice and therefore is not used regularly. Wet chemicals are used to perform both steps in the disclosed gallium arsenide arrangement of the digital etching invention.

Standard wet chemical etching of III–V and certain other semiconductor materials in fact occurs by oxidizing the semiconductor surface and etching the oxide. Typically, this is achieved by submerging the semiconductor in a liquid mixture consisting of an oxidizing agent reactant and a complexing (i.e., oxide-etching) agent reactant. Processes of this type are well known in the art and are described, for example, in the textbook by S. D. Mukherjee and D. W. Woodard, *Gallium Arsenide Materials, Devices, and Circuits*, M. J. Howes and D. V. Morgan, Editors, pp. 123–132, John Wiley and Sons, New York, N.Y. (1985). In this conventional processing arrangement the oxidation and etching occur more or less simultaneously, resulting in an etch depth dependent on the length of time the semiconductor is exposed to the etchant.

Digital etching as provided by the present invention separates these oxidation and oxide etching chemical reactions so that each reaction is independent of the other, and etching therefore occurs in a precisely controllable stepwise fashion through a sequential application of reactants. Moreover because the oxidation chemical reaction (the first step) is found to be essentially self-limiting, the etch depth is no longer dependent on etch time, but is dependent on the number of etching cycles accomplished. In fact, if the oxidation reaction can be minimized to only a few atomic monolayers of the GaAs surface, then substantially any etch depth desired can be obtained by repeated etching cycles.

In the wet digital etching process, the thickness of the material removed during one cycle is therefore determined by the amount of gallium arsenide consumed in the oxidation step. A significant component in wet chemical digital etching according to the invention is therefore to employ a diffusion limited chemical reaction at the semiconductor surface such that the thickness of the new molecular compound formed, i.e., the oxidized gallium arsenide, remains relatively constant over a short time frame (e.g., over a time of minutes). This self-limiting thickness is significant to the digital etching process invention because it results in an effective etch depth that is not proportional to time, but is essentially constant over the time frame desired.

GaAs oxidation has been extensively studied and, in fact, usually occurs according to such a diffusion limited process in which the oxide film thickness increases logarithmically with time. Such characteristics are disclosed, for example, in the technical journal articles of B. Schwartz, *CRC Critical Reviews in Solid State Sciences*, 609, (Nov. 1975); S. S. Cohen, *Thin Solid Films*, 104, 361 (1983); B. Schwartz, *Journal of the Electrochemical Society*, 118, 657 (1971); F. Lukes, *Surf. Sci.*, 30, 91 (1972); B. J. Sealy and P. L. F. Hemment, *Thin Solid Films*, 22, S39 (1974); and G. Lucovsky, *J. Vac SCL Technol.*, 19(3), 456 (1981).

From ellipsometric measurements of the oxide thickness formed on GaAs exposed to air at room temperature over time, it has been determined [by, for example, F. Lukes, *Surf. Sci.* 30, 91 (1972)] that the native oxide of GaAs grows at a logarithmic rate predicted by equation 1 below:

$$d(Å)=5.969+5.929 \log[\ t(min)]\ (1)$$

Even after $10^6$ minutes (about 2 years), the oxide thickness $d(Å)$ formed in this manner measures only 42 angstroms (Å). Measurements of oxide thickness uniformity and chemical stoichiometry [by, for example, G. Lucovsky, *J. Vac. Sci. Technol.*, 19(3), 456 (1981)] have shown that the initial surface oxide (<100 Å) is uniform and chemically homogeneous, yielding Ga to As ratios of approximately 1:1 in the oxide phase. Therefore, it is believed that any uniformity problems which may occur can be avoided by minimizing the oxide layer thickness to less than 100 Å.

For producing such oxide in a fabrication process, hydrogen peroxide, $H_2O_2$, is a well known oxidizer which forms a stable, native oxide of GaAs [as found by, for example, B. Schwartz, CRC Critical Reviews in Solid State Sciences, 609, (Nov. 1975)], and is moreover used in most GaAs wet chemical etchants [as disclosed by, for example, B. Schwartz, CRC Critical Reviews in Solid State Sciences, 609, (Nov. 1975); B. Schwartz, Journal of the Electrochemical Society, 118, 657 (1971); W. Kern, RCA Rev., 39, 278 (1978); D. W. Shaw, Journal of the Electrochemical Society, 128, 874 (1981); and R. E. Williams, Gallium Arsenide Processing Techniques, pp. 93–122, Artech House, Dedham, Ma. (1984)]. Although timed oxidation curves for gallium arsenide exposure to $H_2O_2$ at room temperature are not known to be available, other researchers [for example, B. Schwartz, Journal of the Electrochemical Society, 118, 657 (1971)] have measured an oxide thickness of I 15 A (one hundred fifteen angstroms) after soaking a gallium arsenide sample in $H_2O_2$ for 6 days at room temperature. Even soaking gallium arsenide in boiling $H_2O$ forms only relatively thin oxides of 150 Å [as also found by, for example, B. Schwartz, CRC Critical Reviews in Solid State Sciences, 609, (Nov. 1975)]. Therefore, it is found that $H_2O_2$ oxidizes gallium arsenide with a logarithmic growth rate sufficiently slow to be considered as a self-limiting (diffusion-limited) process which is useful in a semiconductor device fabrication sequences.

For use in the present semiconductor oxidizing function a thirty percent by volume solution of hydrogen peroxide (i.e., with 70 percent water) is found to be satisfactory. It is presently believed however that this concentration can be varied between 0.030 percent and 30.0 percent by volume solution with satisfactory results; an even larger acceptable range is moreover believed feasible. Other oxidizing reactants such as ultraviolet light, ozone and pure oxygen are also believed usable in practicing the invention; however, some of these reactants depart from the desired liquid reactant usage. With the hydrogen peroxide oxidizing agent and gallium arsenide semiconductor material it is found convenient to form an oxide layer that is diffusion-limited to a thickness of between fourteen and seventeen angstroms (14–17 Å) using an oxidation time period of between fifteen and one hundred twenty (15–120) seconds; longer and shorter times, generally seconds to tens of minutes, may however be used. Somewhat different but related oxide layer thicknesses are believed appropriate for other semiconductor materials.

The final step in an etching process of this type, a process which is herein considered to be reasonably described as "digital etching", is to selectively remove the oxide layer formed on the gallium arsenide surface without removing or etching the unreacted gallium arsenide material underneath. This can be easily accomplished by using various acids or bases. The use of acids or bases (without hydrogen peroxide) as an oxide remover and for surface cleaning of gallium arsenide is well known in semiconductor device processing [as disclosed by, for example by S. D. Mukherjee and D. W. Woodard, in *Gallium Arsenide Materials, Devices, and Circuits,* M. J. Howes and D. V. Morgan, Editors, pp. 123–132, John Wiley and Sons, New York, N.Y. (1985) and R. E. Williams, *Gallium Arsenide Processing Techniques,* pp. 93–122, Artech House, Dedham, Ma. (1984)].

A significant step in the herein disclosed digital etching process is to completely separate the chemicals used for each part of a digital etch cycle (i.e., the oxidation step and the oxide etching step). That is, it is necessary to completely remove the $H_2O_2$ by rinsing before applying the acid or base, and vice versa. A residue of either $H_2O_2$ or acid or base on the gallium arsenide wafer will mix with the next application of $H_2O_2$ or acid or base and provide a conventional or normal acid or base plus $H_2O_2$ etchant that destroys the controlled, self-limiting etching process. Because $H_2O_2$ and many acids or bases contain water, the use of additional water, deionized water (DI H2O), is selected to provide the necessary rinsing between each step of a digital etch cycle. To additionally prevent dilution of the chemical agents, a dry nitrogen, $N_2$, blow-dry may be used to remove any water remaining after rinsing.

A new device may be used to separately provide fresh oxidizing rinsing and etching solutions to the sample during each step of an etch cycle and thereby minimize the undesired chemical cross contamination. Since contamination due to incomplete rinsing must be eliminated to maintain the digital etching chemistry, a photoresist spinner may be modified for use in performing the digital etching procedure. Such modification consists of replacing exposed metal parts (wafer chuck, vacuum shaft and spinner baseplate) with oxidizer and acid or base resistant high density polypropylene and/or Teflon® or equivalent materials machined to original specifications. With such a spinner, fresh oxidizing and etching solutions can be sprayed from above onto the sample during each etch step of a digital etching cycle. The spinning motion provided by the modified spinner removes the applied solution quickly, and allows the application of a continuously fresh stream of solution. DI $H_2O$ rinsing of the wafer can also take place while spinning, thus providing a continuously fresh water stream to remove the oxidizing and etching solutions. In this manner, fresh solutions of $H_2O_2$, acid or base, and DI $H_2O$ are applied to the sample during the digital etch, thereby eliminating cross contamination between $H_2O_2$ and the acid or base.

Spin rinsing with fresh DI $H_2O$ for 15 seconds at 1000 rpm is found to be sufficient to remove both the oxidizing and etching solutions from the wafer before applying the next solution in the digital etch process. Spinning the wafer during applications of the oxidizing and etching solutions is not necessary however, since soaking the wafer during these steps is also found to be sufficient. The measured digital etch rates of this soak and spin rinsing method are found to be equivalent to those obtained using a continuous spin technique as illustrated below herein. Soaking is desirable because it provides a large reservoir of solution to perform the necessary oxidation and etching without depleting the applied solution. The static chemical soak and spin rinsing technique is found to maintain desirable repeatability and reproducibility even when the soak is performed manually. It has been found difficult to insure complete coverage with manual spraying, whereas a static flood is easy to accomplish and maintain during given soak times. Table 1 describes the results of using a combined chemical soak and spin rinsing procedure.

TABLE 1

Procedure Used to Perform a Single Wet Chemical Digital Etching Cycle

| Step | Procedure | Chemical Used | Application Time (sec) | Spin Speed (rpm) |
|---|---|---|---|---|
| A | • Apply and soak wafer with oxidizing agent | $H_2O_2$ | 15–120 | 0 |
|  | • Rinse away oxidizing agent | DI $H_2O$ | 15 | 1000 |
|  | • Blow dry to remove rinsing agent | $N_2$ | 5 | 1000 |
| B | • Apply and soak wafer with oxide removing agent | Acid | 15–120 | 0 |
|  | • Rinse away oxide removing agent | DI $H_2O$ | 15 | 1000 |
|  | • Blow dry to remove rinsing agent | $N_2$ | 5 | 1000 |

Spinning may be applied if desired in the first reaction of steps A and B in table 1; we found it convenient to omit spinning in these reactions.

Etch Dept Measurements

Since digital wet etching according to the invention results in a small etch depth for each digital etch cycle performed (about 15 Å/cycle), numerous etch cycles may be necessary in a laboratory depth measurement sequence in order to provide sufficient thickness change for obtaining an accurate measurement. Two depth profiling techniques may be used in such a sequence to measure and verify the digital etch rate of gallium arsenide. Although a mechanical profilometer has a rated resolution of 1 Å, it can only accurately measure about 150 Å or more in relative etch depth change, therefore 10 or more digital etching cycles are required to make this instrument viable. However, even this 10-cycle depth approaches the accuracy of mechanical profilometers. Other measurement techniques capable of measuring smaller etch depths than a mechanical profilometer include atomic force microscopy (AFM) and Hall effect measurement techniques. AFM and mechanical profilometer measurements require masking of the sample surface because direct etch depth measurements are made by comparing the etched surface depth relative to the unetched surface. Masking is accomplished using standard lithographic techniques to open trenches in the photoresist. For these measurements, a 100 μm wide trench may be used for mechanical profilometer measurement. Additional information regarding the Hall effect measurement technique is to be found in the technical article of G. C. DeSalvo, D. C. Look, C. A. Bozada, and J. L. Ebel, "Depth Measurement of Doped Semiconductors Using the Hall Technique", *J. Appl. Phys. Vol* 81, page 281–284, January 1997.

Using a sensitive Hall effect measurement system, the depth of a given semiconductor surface can be indirectly measured by comparing the difference in the electrical parameters measured by Hall effect before and after etching. The Hall effect technique does not require masking of the sample surface; it measures the average change in depth across relatively large surface areas (e.g., 1 cm²). Since the Hall effect measurement technique uses an electrical and not a mechanical measurement, errors due to mechanical vibration noises are eliminated and the resolution of the etch depth measurement is limited only by errors from the electrical measurement system. As an example, from accuracy and signal-to-noise considerations alone, the Hall effect technique can potentially resolve thickness changes of less than 1 Å in a 500 Å thick gallium arsenide layer doped at the $10^{18}$ cm$^{-3}$ level. However, other factors such as non uniform doping, non abrupt depletion region and unscreened ionized impurities can detract from this accuracy of a Hall effect measurement.

To provide an exemplary use of the Hall technique in a setting involving the present invention, several semiconductor wafers having 350 Å to 2000 Å thick layers of heavily n-type Si doped ($5\times10^{18}$ cm$^{-3}$) gallium arsenide on (100) semi-insulating gallium arsenide substrates from molecular beam epitaxy (MBE) may be considered. The layer thicknesses are thin to maximize the change in Hall effect parameters after digital etching. Since the underlying substrate is semi-insulating, the electrical properties measured by the Hall effect technique are only due to the n-pe grown layer. Hall measurements are performed on 6 millimeter by 6 millimeter pieces from these wafers to determine the Hall resistance, mobility and doping concentration. From these measurements the change in thickness (loss of material) due to etching can be calculated, even though the exact thickness (t) of the sample cannot be determined. This change in thickness ($\Delta_t$) in terms of the differences between Hall effect measured values is calculated using, for example, the technique described in G. C. DeSalvo, D. C. Look, C. A. Bozada, and J. L. Ebel, "Depth Measurement of Doped Semiconductors Using the Hall Technique", *J. Appl. Phys. Vol* 81, page 281–284, January 1997 and equation (2) as follows:

$$\Delta t = t_2 - t_1 = \frac{\mu_{n_2} n_{s_2} - \mu_{n_1} n_{s_1}}{\mu_{n_0} n_0} \quad (2)$$

where $n_0$ and $\mu_{n_0}$ are the initial volume carrier concentration (cm$^{-3}$) and mobility (cm²/V sec) measured before any etching of the sample occurs, and $n_s$ and $\mu_n$ are the sheet carrier concentration (cm$^{-2}$) and mobility (cm²/V sec) of the sample measured by the Hall effect technique just prior to etching ($n_{s1}$, $\mu_{n1}$) and after etching ($n_{s2}$, $\mu n_2$). An accurate determination of the volume carrier concentration ($n_0$) requires MBE growths of identical material layers of different original thicknesses in order to correct for surface and interface depletion effects. Once $n_0$ and $\mu_{n0}$ have been measured, the thickness of the sample prior to etching does not need to be known because the equation calculates the change in thickness ($t_2-t_1$) before and after etching. The sample can be etched repeatedly and the change in thickness calculated until the n-type layer becomes too thin for accurate Hall effect measurement. Additional details of this Hall effect measurement are disclosed in the following topic.

Hall Effect Measurements

Consider a semiconductor material of thickness (t) that is artificially segmented into N thin layers with depth $\Delta z$ such that ($t=N\Delta Z$), where $\Delta z$ is thin enough that the volume carrier concentration (n) and mobility ($\mu$) do not vary appreciably within a given layer. As described by D. C. Look, *Electrical Characterization of GaAs Materials and Devices, (John Wiley and Sons, New York, N.Y.), (*1989) and R. L. Petritz, *Theory of an Experiment for Measuring the Mobility and Density of Carriers in the Space-Charge Region of a Semiconductor Surface,* Phys. Rev., 110, 1254 (1958) it can be shown that the measured electrical parameters of sheet conductivity ($\sigma$) and sheet Hall coefficient ($R_s$) are given by $$\sigma_s = \sum_{i=1}^{N} \sigma_i \Delta z \quad (3)$$

$$R_s \sigma_s^2 = \sum_{i=1}^{N} R_i \sigma_i^2 \Delta z \quad (4)$$

where $\sigma_i$ is the volume conductivity and $R_i$ is the volume Hall coefficient of layer i. The measured quantities $\sigma_s$ and $R_s$ are related to mobility ($\mu$) and sheet carrier concentration ($n_s$) in the usual manner:

$$\sigma_s = q\mu n_s \quad (5)$$

$$R_s = 1/q n_s \quad (6)$$

The Hall scattering factor ($r_H=qnR$) is assumed to be unity, which is true for degenerate carriers (for example, when n>$10^{17}$ cm$^{-3}$ in gallium arsenide). The sheet and volume electrical quantities are related to the semiconductor thickness (t) by $n_s=nt$, $\sigma_s=\sigma t$, and $R_s=R/t$. Note from Equations 5 and 6 that mobility ($\mu=\sigma_s R_s$) can be calculated without a thickness measurement. The Hall technique is used to measure $\sigma_s$ and $R_s$ before (j) and after (j+1) a change in thickness such that $$\sigma_{s_j} - \sigma_{s_{j+i}} = \sum_{i=j}^{N} \sigma_i \Delta z - \sum_{i=j+1}^{N} \sigma_i \Delta z \quad (7)$$

$$= \sigma_j \Delta z$$

-continued $$(R_s\sigma_s^2)_j - (R_s\sigma_s^2)_{j+1} = \sum_{i=j}^{N} R_i\sigma_i^2 \Delta z - \sum_{i=j+1}^{N} R_i\sigma_i^2 \Delta z \quad (8)$$

$$= R_j\sigma_j^2 \Delta z = qn_j\mu_j^2 \Delta z$$

These equations are normally used to get $n_j$ and $\mu_j$ [or $\mu(z)$ and $\mu(z)$] as a function of depth by measuring the semiconductor thickness change ($\Delta z$) at each step. However, if the volume carrier concentration and mobility are constant with depth and are known beforehand, then either Equation 7 or Equation 8 can be used to calculate the thickness change ($\Delta z$) due to etching.

The carrier concentration and mobility can be determined beforehand by comparing two separate semiconductor layers which are identical in every way except for metallurgical thickness ($t_m$). The use of different layer thicknesses is necessary because the electrical thickness ($t_e$) is less than the metallurgical thickness ($t_m$) due to surface ($w_s$) and interface ($w_i$) depletion widths [cf. Equation 11]. If the carrier concentration and mobility are identical for both semiconductors (samples A and B) in the electrically conducting regions ($t_{eA}$ and $t_{eB}$), then the carrier concentration can be determined by mathematically eliminating the depletion regions to give $$n = \frac{n_{s_B} - n_{s_A}}{t_{m_B} - t_{m_A}} \quad (9)$$

where $$w_s + w_i = \frac{(n_0 t_{m_A} - n_{s_A})}{n_0} = \frac{(n_0 t_{m_B} - n_{s_B})}{n_0} \quad (10)$$

$$t_e = t_m - (w_s + w_i) \quad (11)$$

Since the measurement of mobility is independent of thickness, it should be the same for both samples A and B if the uniform material assumptions are correct. As seen in Table I the mobility is constant if the samples are thick enough, but begins to fall off as the semiconductor layer becomes thinner (350 Å in this case). One of the reasons for such a fall off is the fact that the depletion "walls" are not abrupt, but have a width approximately given by the Debye length ($\approx$18 Å for n=5×10$^{18}$ cm$^{-3}$). Thus, for a very small electrical thickness ($t_e \approx$85 Å), carrier concentration and mobility would be expected to vary over an appreciable portion of $t_e$. As observed, the mobility is lower because the decrease in carrier concentration in the upper and lower Debye tails results in less screening of the ionized impurities. In other words, a larger fraction of the electrons see unscreened impurities and thus have lower mobilities.

From experimental studies conducted, it has been found that Equation 7 seems to give the most consistent results for etch depth determination. Thus, solving Equation 7 for the change in thickness in terms of ($\Delta z = t_1 - t_2$, where $t_1 > t_2$) results in $$\Delta z = \frac{\sigma_{s_j} - \sigma_{s_{j+1}}}{\sigma_j} \quad (12)$$

$$= \frac{q\mu_j n_{s_j} - q\mu_{j+1} n_{s_{j+1}}}{q\mu_j n_j}$$

Or $$\Delta z = t_1 - t_2 = \frac{\sigma_{s_1} - \sigma_{s_2}}{\sigma_0} = \frac{\mu_1 n_{s_1} - \mu_2 n_{s_2}}{\mu_0 n_0} \quad (13)$$

where $n_0$ and $\mu_0$ are the initial volume carrier concentration and mobility of the semiconductor layer measured before any etching.

Yet further details of this new Hall effect technique used to measure changes in semiconductor thickness are disclosed in the published paper of G. C. DeSalvo, D. C. Look, C. A. Bozada, and J. L. Ebel, "Depth Measurement of Doped Semiconductors Using the Hall Techniques", *J. Appl. Phys.* Vol 81, page 281–284, January 1997.

EXAMPLE

Table 1 above discloses specific semiconductor removal details of the digital etching procedure. A single digital etching cycle consists of both Steps A and B, which are repeated to obtain a desired etch depth. Table 2 and Table 3 below show the results of exemplary uses or experiments conducted to both optimize the wet chemical digital etching procedure and to verify the functionality of the procedure. These experiments focus on the following cases or aspects of the digital etching process:

1. Oxide removal chemical selection,
2. Oxidation chemical selection ($H_2O_2$ or $H_2O$),
3. Etch rate dependence on the number of etch cycles (FIG. 1),
4. Oxidation and oxide removal dependence on soak times (Table 4).

Work relating to each of these cases is conducted in a climate controlled clean room at room temperature (20° C.) under yellow fluorescent lighting to prevent unwanted exposure of photoresist used for mechanical profilometer measurements. Each of the cases uses a ten cycle digital etch except for case (#3) where the number of etch cycles is varied. One minute soak times are used for both Steps A and B, except for case (#4) in which the soak times of the oxidizing agent and the oxide removal agent are varied. Finally, except where noted, the Hall technique is used to measure the etch depths obtained.

A comparison of six different chemical solutions used as the oxide etchant in the present invention digital etch procedure appears in Table 2. These solutions consist respectively of hydrochloric acid (HCl), 1 molar citric acid, phosphoric acid ($H_3PO_4$), sulfuric acid ($H_2SO_4$), buffered oxide etch (BOE), and ammonium hydroxide ($NH_4OH$).

TABLE 2

Digital Etch Rate Dependence on Acid or Base Selection
Using a 10x Digital Etch Step Repetition
1 minute Acid Soaks and 1 minute $H_2O_2$ Soaks

| Acid or Base | Etch Rate (Å/Cycle) |
| --- | --- |
| HCl:$H_2O$ (1:1) | 15.5 |
| 1 Molar Citric Acid ($C_6H_8O_7$) | 14.3 |
| $H_3PO_4$:$H_2O$ (1:4) | 12.6 |
| $H_2SO_4$:$H_2O$ (1:10) | 11.4 |
| HF:$NH_4F$ [BOE] (1:7) | 15.5 |
| $NH_4OH$:$H_2O$ (1:1) | 29.6 |

The digital etch rates disclosed in Table 2 are calculated using the equation:

$$\text{Digital Etch Rate (Å/cycle)} = \frac{\text{Measured etch depth (Å)}}{\text{Number of digital etch cycles}} \quad (3)$$

Hall measurements show that any of these acids remove the gallium arsenide-oxide and give a fairly constant etch depth and calculated etch rate, the latter being shown in the second column of Table 2. However, the base, $NH_4OH$, produces an etch rate double that of the acids. Some acids and bases such as $HNO_3$ are known to be both oxidizing and oxide removing agents, $NH_4OH$ may therefore be a partial oxidizing agent as well as an oxide removal agent, a concept which would account for this larger etch rate. (See D. J. Stirland and B. W. Straghan, Thin Solid Films, 31, 139 (1976) and S. Adachi and K. Oe, Journal of the Electrochemical Society, 130, 2427 (1983) regarding this combined action.) Since $H_2O$ can oxidize gallium arsenide as is disclosed in B. Schwartz, CRC Critical Reviews in Solid State Sciences, 609, (Nov. 1975) and B. Schwartz, Journal of the Electrochemical Society, 118, 657 (1971), it is significant to know if $H_2O$ present in the wet chemical digital etching process will significantly oxidize gallium arsenide during the soak times.

In a second measurement of the Table 2 type, DI $H_2O$ may be substituted for $H_2O_2$ as the oxidizing agent and one of the reactants HCl, citric acid, or $NH_4OH$ used as the oxide removing agent to determine these questions. Many acids or bases incorporate water and if gallium arsenide is significantly oxidized by water, then a wet chemical digital etching technique is not possible. However, this second measurement experiment gave total etch depths (not the etch rate) of 4.2 Å with HCl, 13.8 Å with citric acid, and 57.4 Å with $NH_4OH$ after performing a 10-cycle digital etch. From this experiment, it is concluded that $H_2O$ does not act as a significant oxidizing agent for gallium arsenide when applied for one minute soak times because no significant etching was measured. It is believed that the small etch depths measured for the acids are attributable to removal of the native oxide present on gallium arsenide prior to digital etching [see B. Schwartz, CRC Critical Reviews in Solid State Sciences, 609, (Nov. 1975); S. S. Cohen, Thin Solid Films, 104, 361 (1983) and F. Lukes, Surf. Sci., 30, 91 (1972) regarding this point]. The results obtained from the DI $H_2O$ and $NH_4OH$ 10×digital etch process show definite etching with a measured etch rate of 5.74 Å/cycle. When compared to the etch rates obtained when using $H_2O_2$ with $NH_4OH$, it can be concluded that $NH_4OH$ is also oxidizing the gallium arsenide surface resulting in larger etch depths and faster etch rates.

Three additional experiments as represented in Table 3 and FIG. 1 were conducted using HCl:$H_2O$ (1:1) as the oxide removing agent. HCl acid was selected for these etchings because it 35 appears to have the lowest chemical interaction with gallium arsenide for digital etching, yielding a 4.2 Å etch depth after 10 cycles with water as the oxidizing agent. The third of these experiment varied the number of digital etch cycles from 5 to 30. The average etch depth and calculated etch rate values are presented in Table 3 and appear graphically in FIG. 1. Increasing the number of digital etch cycles produces larger etch depths, but the etch rate as calculated by Equation 5 remains relatively constant.

A useful feature of the digital etch process, therefore, is that the etch depth is directly proportional to the number of etch cycles executed. With the digital etch process, the final etch depth is thus determined not by the time length of the etch as in conventional etching, but instead by the number of standard etch cycles performed. Therefore, the amount of material etched is always a multiple of the single cycle etch depth. FIG. 1 in fact graphically displays the linear relationship between the etch depth and the number of etch cycles, demonstrating that the etch rate remains constant for all etch cycles. The procedure of counting a number of constant or standard cycles to determine a total etch depth is suggestive of the principle of a digital clock or other digital displays, and therefore gives rise to the name "digital etching" used for the present invention.

The fourth digital etching experiment varies the $H_2O_2$ and HCl soak times. First, the $H_2O_2$ soak times are kept constant at 1 minute, while the HCl soak time is varied between 15 seconds and 120 seconds [column 2 of Table 4]. Then, the HCl soak times are held constant at 1 minute while the $H_2O_2$ soak time is varied from 15 seconds to 120 seconds [column 3 of Table 4]. Finally, both soak times are set equal and varied at the same rate, resulting in etch time variations from very short etch cycles to very long etch cycles [column 4 of Table 4]. Because this digital etching was performed manually, and short soak times may involve significant timing errors, soak times of 15 seconds or greater are used. The purpose of this experiment is to determine minimum soak times needed to oxidize the gallium arsenide surface and remove the oxide layer. In standard etching techniques, the etch rates (Å/sec) are dependent on time, such that longer etch times result in deeper etch depths. Digital etching has etch rates (Å/cycle) that are independent of etch times, so that the etch depth is only dependent on the number of digital etch cycles performed. However, this is only true when each soak time is longer than the minimum time needed to oxidize the semiconductor layer or to remove this oxide layer.

The purpose of experiment 4 is to determine the minimum soak times necessary in order to have a practical usable digital etching technique. The results indicate that soak times as short as 15 seconds are sufficient to perform a good digital etch. The results from Table 4 show there is no significant variation in the etch depths or the calculated etch rates for all soak time variations from 15 seconds to 120 seconds. Therefore, the oxide formation and oxide removal occur in less than 15 seconds. Because longer soak times do not appreciably increase the overall etch rate or the etch depth, this process is self-limiting in terms of both oxide layer formation and oxide layer removal. That is, longer chemical soak times do not result in larger etch depths, and have no effect on the overall etch rate. With an automated digital etching station where precise control of soak time can be achieved, soak times of less than 15 seconds are also possible, therefore the time to perform the digital etching process may in fact be reducible and removal of thinner semiconductor layers possible. Such an automated digital etching station may also be used in the manner of experiment 4 to determine the minimum soak times necessary to maintain a constant digital etch rate, such that an optimized digital etching process can be achieved.

TABLE 3

Digital Etch Rate Dependence on the Number of Digital Etch Cycles
Performed Using 1 min $HCl:H_2O$ (1:1) Soaks and 1 min $H_2O_2$ Soaks

| | Hall Technique | | Mechanical Profilometer | |
| --- | --- | --- | --- | --- |
| Number of Digital Etch Cycles | Averaged Measured Etch Depth (Å) | Calculated Etch Rate (Å/Cycle) | Average Measured Etch Depth (Å) | Calculated Etch Rate (Å/Cycle) |
| 5 | 79 | 15.9 | — | — |
| 9 | 132 | 14.7 | — | — |
| 10 | 155 | 15.5 | 158 | 15.8 |
| 15 | 231 | 15.4 | 240 | 16.0 |
| 20 | 328 | 16.4 | 326 | 16.3 |
| 30 | 509 | 17.0 | 462 | 15.4 |

TABLE 4

Digital Etch Rate Dependence on Digital Etch Soak Time
Using a 10x Digital Etch Cycle Repetition

| Variable x | Digital Etch Rate (Å/Cycle) | | |
| --- | --- | --- | --- |
| Chemical Soak Time (sec) | 60 sec $H_2O_2$, x sec Hcl | x sec $H_2O_2$ 60 sec HCl | x sec $H_2O_2$ x sec HCl |
| 7 | — | — | 14.2 |
| 15 | 15.9 | 15.7 | 14.4 |
| 30 | 14.4 | 19.4 | 15.7 |
| 45 | 15.2 | 17.1 | 17.7 |
| 60 | 15.5 | 15.5 | 15.5 |
| 90 | 15.2 | 14.6 | 16.3 |
| 120 | 14.1 | 16.0 | 15.6 |

In the last three columns of Table 4 numbers represent values of the variable x identified in the first column heading.

Initial atomic force microscopy measurements of digital etch depths of gallium arsenide in photoresist trench openings having widths of 15 μm, 5 μm, and 0.2 μm are in general agreement when measured with the Hall effect technique and with mechanical profilometer measurements. Determination of any digital etch depth dependence on exposed surface opening (photoresist trench width) may be accomplished by atomic force microscopy. Atomic force microscopy measurements of surface roughness may also be performed to determine the change in surface roughness from using the digital etching technique.

Therefore for practical purposes, the soak times considered in this work, the amount of material etched during a single digital etch cycle does not depend on the length of soak time for the $H_2O_2$ or acid, but rather on the number of digital etch cycles performed. The thickness removed by one digital etch cycle equals the amount of semiconductor material consumed in the oxidation step. Oxidation of gallium arsenide with $H_2O_2$ therefore tends to be a self-limiting process providing a constant oxide layer thickness of about 15 Å for $H_2O_2$ soak times from 15 to 120 seconds. For a constant digital etch rate, it is desirable to select an acid or base which removes the oxide layer without further oxidizing the gallium arsenide surface, as such oxidation causes unpredictable etch rates. Therefore, acids or bases that oxidize gallium arsenide such as $HNO_3$ and $NH_4$ OH are not suitable for the wet chemical digital etching.

Figure 2:
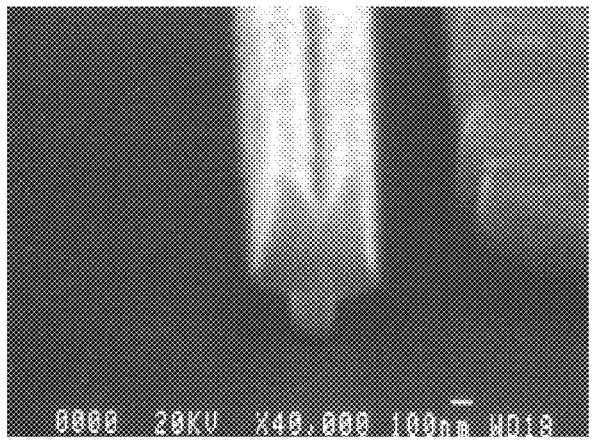
FIG. 2 shows a scanning electron micrograph representation of a 0.2 μm gate footprint and gate recess trench of an AlGaAs/InGaAs/GaAs pHEMT device formed according to the invention.

FIG. 2 in the drawings shows a scanning electron microphotograph of a 0.2 μm gate footprint and gate recess trench of an AlGaAs/InGaAs/GaAs pHEMT device formed using a hydrogen peroxide/hydrochloric acid digital etching gate recess process according to the invention. In the FIG. 2 device the present digital etching arrangement was used to perform the gate recess etch for the AlGaAs/InGaAs/GaAs pHEMT structure to enable a determination of its performance in comparison with standard selective etching. In the FIG. 2 structure the wet chemical etch region gate recess trench appears surrounding the lowermost part of the left hand object in the region underlying the vee shaped wedge structure gate. Also for the FIG. 2 drawing a pHEMT wafer was cleaved into pieces after e-beam gate lithography, but just prior to gate recess etching. Part of the cleaved wafer was processed as usual, using the citric acid/hydrogen peroxide etchant system [disclosed in G. DeSalvo, W. Tseng, and J. Comas, *Etch Rates and Selectives of Citric Acid/Hydrogen Peroxide on GaAs*, $Al_{0.3}Ga_{0.7}As$, $In_{0.2}As$, $In_{0.53}Ga_{0.47}As$, $In_{0.52}Al_{0.48}As$, and InP, J. Electrochem. Soc. 139, 831 (1992)] to perform a selective gate recess on the pHEMT structure. Another portion of the wafer was gate recessed using the wet chemical digital etching technique. Since the selective etch will only etch the gallium arsenide ohmic contact layer and stop on the Aluminum Gallium Arsenide barrier layer, the digital etch was only used to etch the same gallium arsenide layer and was stopped before etching proceeded into the aluminum gallium arsenide barrier. In this manner, both gate recess etching techniques can be compared, and the etch depth control in removing the gallium arsenide ohmic contact layer using the digital etching process can be determined.

Figure 3:
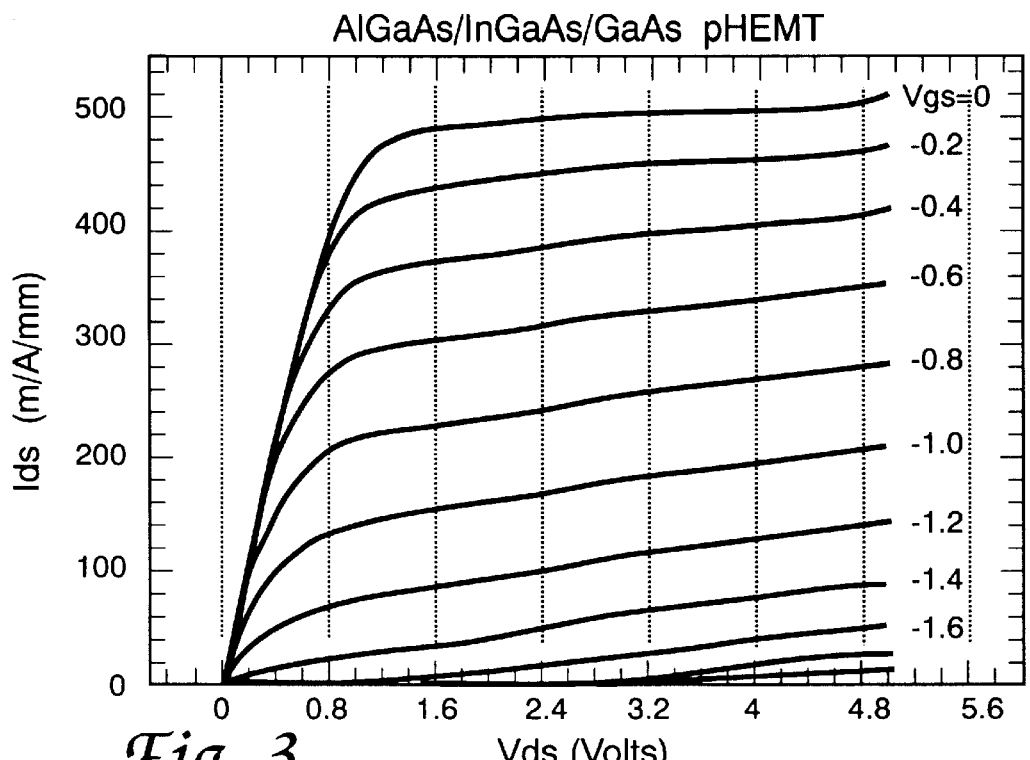
FIG. 3 shows $I_{ds}$-$V_{gs}$ transistor curves for an AlGaAs/InGaAs/GaAs pHEMT device achieved using a hydrogen peroxide/hydrochloric acid digital gate recess etch according to the invention.
Figure 4:
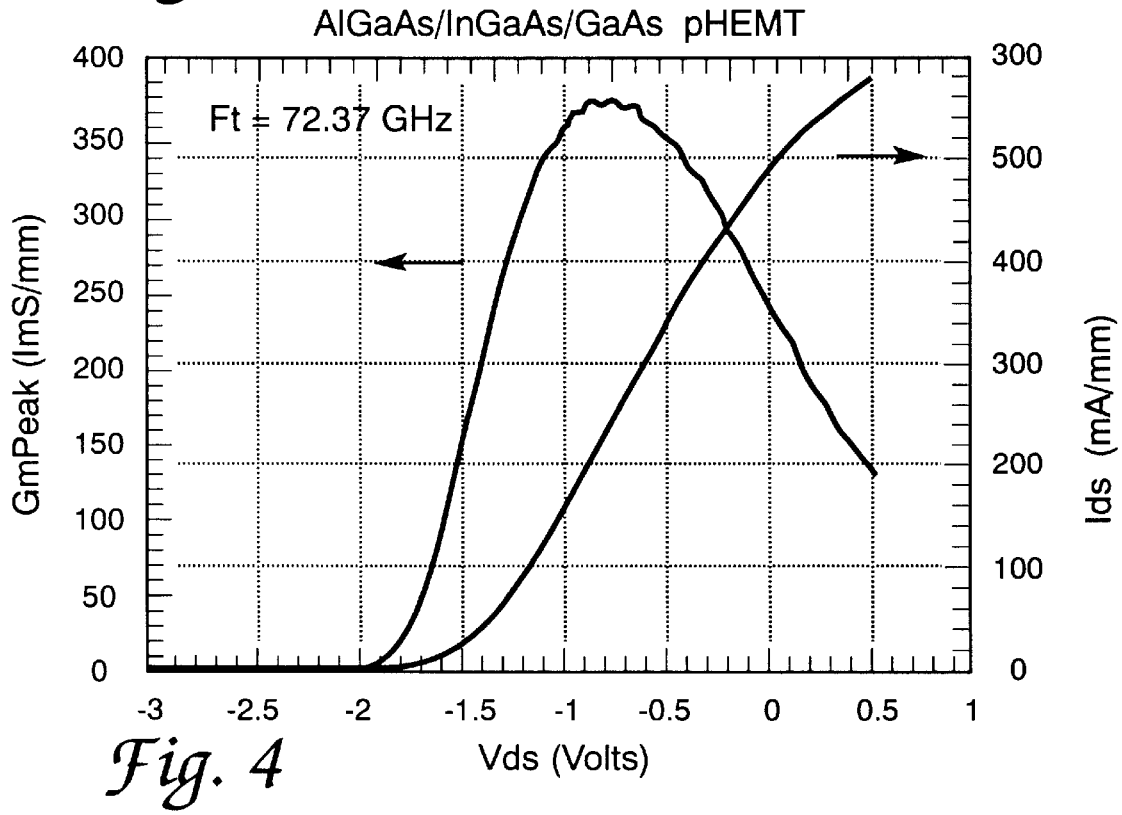
FIG. 4 shows $I_{ds}$-$V_{gs}$ and gm transconductance curves for an AlGaAs/InGaAs/GaAs pHEMT device fabricated with a digital gate recess etch according to the invention.

In connection with FIG. 2, device results from the pHEMT structure were used to determine how well the digital etching technique could perform the gate recess as compared to a selective gate recess. In general, there is very little difference in DC and RF device performance between both processes. With respect to the drain-source characteristics, as shown in FIG. 3, an average peak transconductance of 382 mS/mm, a pinch off voltage of −1.9 V, and a cutoff frequency of 73 GHz are measured for the selectively etched gate recess devices, while an average peak transconductance of 371 mS/mm, a pinch off voltage of −1.8 V, and a cutoff frequency of 72 GHz are achieved for the digitally etched gate recess devices.

The pHEMT device results indicate the digital gate etch compares favorably with the standard selective gate etch, demonstrating comparable etch depth precision. For the MESFET device structure, where the heterostructure is not present, this technique offers a desirable method to precisely control the gate recess etch to the desired etch depth with needed repeatability and precision. Also, the digital etch technique affords process invariance when compared to normal fixed timed etching of the MESFET gate. Finally, since the disclosed digital etching technique only requires standard wet chemicals with a modified photoresist spinner, the process can be automated and incorporated into a manufacturing process.

Wet chemical digital etching does not require high vacuum nor does it heat the wafer as has been reported for RIE; (reported in T. Matsuura, J. Murota, and Y. Sawada, *Appl. Phys. Lett.*, 63, 2803 (1993), and M. Ishii, T. Meguro, K. Gamo, T. Sugano, and Y. Aoyagi, *Jpn. J. Appl. Phys.*, 32, 6178 (1993)). Nor is heating as required by MBE (450° C. −500° C.), (and as reported in S. Takatani and T. Kikawa, Appl. Phys. Lett., 65, 2585 (1994)), necessary. This process also does not require an ohmic contact or a conducting layer/substrate as does anodic oxidation. Finally, wet chemical digital etching has the ability to save processing time since it does not require the use and preparation of specialized equipment such as does RIE, MBE, or an anodic oxidation system.

The present invention therefore involves the use of wet chemicals to perform both digital etching steps for group III–V semiconductor materials such as gallium arsenide. The basic process consists of using hydrogen peroxide (30% $H_2O_2$) as the oxidizing agent to form gallium arsenide-oxide compounds at the Gallium Arsenide surface (an oxidation step), these compounds are then removed using an acid (i.e., an etching step). This simple wet etching technique uses standard device fabrication chemicals and provides an economical and controllable etch with etch depth increments of approximately 15 Å. As in normal device fabrication, a photoresist mask can be used with this digital etching process to pattern the etching.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The wet process electrical current-free high resolution stepwise method of removing a selected thickness of semiconductor material from the surface of a semiconductor wafer, said method comprising the steps of:

oxidizing a topmost surface portion of said semiconductor material with a wet process oxidizing first fresh reactant material;

said oxidizing step being of a zero electrical current flow nature and having self-limiting properties as to achieved oxidized semiconductor material layer thickness by way of a diminishing return timewise decreasing rate of oxidation mechanism;

removing said oxidizing first reactant material from said semiconductor material and said oxidized surface portion thereof with a spinning wafer rinsing operation sufficient to preclude significant concurrent presence intermixing of said oxidizing first reactant material with subsequently applied reactant materials on said wafer;

etching away said oxidized layer of said semiconductor material with a wet process second fresh reactant material;

said wet process second fresh reactant material being selectively reactive with said semiconductor material oxidized portion and relatively nonreactive with underlying non-oxidized portions of said semiconductor material;

rinsing said wet process second fresh reactive material from said remaining semiconductor material using a second spinning wafer rinse until intermixed second and subsequent reactive material activity with said semiconductor material is precluded; and repeating said oxidizing, removing, etching away and rinsing steps in sequence using fresh materials until said selected thickness of said semiconductor material has been removed.

2. The method of claim 1 wherein said diminishing return timewise decreasing rate of oxidation mechanism is a diffusion limited chemical mechanism characterized by a logarithmic with time mathematical function.

3. The method of claim 2 wherein said diminishing return timewise decreasing rate of oxidation mechanism is terminated after:

a time period measured in time increments between seconds and tens of minutes;

with an oxide thickness measuring between one of the thicknesses measures of, hundredths of an asymptote oxide layer thickness and tenths of an asymptote oxide layer thickness; and between 1 and 20 monolayers.

4. The method of claim 3 wherein said diminishing return timewise decreasing rate of oxidation mechanism is manually terminated after a time period of less than 120 seconds.

5. The method of claim 1 wherein said removing and rinsing steps each include a semiconductor material surface-wetting, washing away operation and are each followed by a semiconductor material surface drying operation.

6. The method of claim 1 wherein each of said steps is performed at room temperature with room temperature-maintained liquid phase materials.

7. The method of claim 1 wherein said semiconductor material comprises an uncompleted portion of a field-effect transistor.

8. The method of claim 1 wherein said semiconductor material is comprised of periodic table group III–V elements and said oxidation mechanism is terminated after a period of between less than 15 and 120 seconds at an oxide thickness measuring between 14 and 17 angstroms.

9. The method of claim 8 wherein said semiconductor material is comprised of gallium arsenide and said wet process second reactant material is one of an acid and a base material.

10. The method of claim 9 wherein said wet process oxidizing first reactant material is comprised of an aqueous solution of hydrogen peroxide.

11. The method of claim 9 wherein said wet process second reactant material is comprised of one of the materials of citric acid, phosphoric acid, sulfuric acid, hydrofluoric acid, hydrochloric acid and ammonium hydroxide.

12. The method of claim 9 wherein said removing and rinsing steps each include a gallium arsenide semiconductor material surface wetting operation with water and are each followed by a dry gas semiconductor material surface drying operation.

13. The method of claim 12 wherein said water is deionized water and said dry gas is nitrogen.

14. The method of claim 9 further including the step of masking said semiconductor material wafer with photoresist materials prior to one of said steps.

15. A wet process electrical current-free high resolution stepwise method of removing a precise thickness of semiconductor material from the surface of a semiconductor wafer, said method comprising the steps of:

chemically altering a topmost surface portion of said semiconductor material with a wet process fresh solution first reactant material;

said chemically altering step being electrical current free and chemically self-limiting as to altered semiconductor material layer thickness achieved by way of a diminishing return timewise decreasing rate of alteration reaction mechanism;

removing said first reactant material from said semiconductor material and said altered surface portion thereof with a spinning wafer cleaning operation sufficient to preclude significant wafer surface intermixing of said first reactant material with subsequently applied reactant materials;

consuming said altered layer of said semiconductor material with a wet process fresh solution second reactant material;

said wet process second reactant material being selectively reactive with said chemically altered semiconductor material topmost surface portion and relatively nonreactive with underlying unaltered portions of said semiconductor material;

displacing said wet process second reactive material from said remaining semiconductor material until intermixed second and subsequent reactive material activity with said underlying unaltered semiconductor material is substantially precluded;

said displacing step including a spinning wafer wet displacement of said second reactive material;

repeating said chemically altering, removing, consuming and displacing steps in sequence using fresh materials until said precise thickness of said semiconductor material has been removed.

16. The method of claim 15 wherein said semiconductor material is comprised of gallium arsenide, said chemically altering step comprises oxidation of said gallium arsenide material and said consuming step comprises one of an acidic and a basic preferential chemical reaction with oxidized gallium arsenide material.

17. The method of claim 1 wherein said oxidizing and etching away steps are accomplished under static soaking conditions.

18. The method of claim 11 wherein said wet process second reactant material is hydrochloric acid.

19. A wet process electrical current-free iterative method of removing semiconductor material from a wafer, said method comprising the steps of:

altering composition of a limited thickness surface portion of said wafer material using a wet process virgin first reactant material electrical current free chemical reaction;

cleansing said first reactant material from said wafer using a rotating wafer wet cleansing;

consuming said altered layer of wafer material using a selective wet process virgin second reactant material chemical reaction;

removing remaining of said wet process second reactive material from said wafer using a second rotating wafer wet cleansing;

iterating said altering, cleansing, consuming and removing steps in sequence until a selected thickness of said wafer is removed.

20. The method of removing semiconductor material of claim 19 wherein said semiconductor material is gallium arsenide, said first reactant material is an oxidizing agent, said second reactant material is an oxygen free acid reactive with said compositionally altered wafer material but inert with respect to underlying unaltered wafer material and wherein said wet cleansings comprise deionized water cleanings.

* * * * *